United States Patent [19]

Nozawa et al.

[11] Patent Number: 5,147,497
[45] Date of Patent: Sep. 15, 1992

[54] PLASMA APPARATUS, AND METHOD AND SYSTEM FOR EXTRACTING ELECTRICAL SIGNAL OF MEMBER TO WHICH HIGH-FREQUENCY WAVE IS APPLIED

[75] Inventors: Toshihisa Nozawa; Osamu Kamikanda; Yukimasa Yoshida, all of Yokohama; Haruo Okano, Tokyo, all of Japan

[73] Assignees: Tokyo Electron Limited, Tokyo; Kabushiki Kaisha Toshiba, Kawasaki, both of Japan

[21] Appl. No.: 731,261

[22] Filed: Jul. 17, 1991

[30] Foreign Application Priority Data

Jul. 20, 1990 [JP] Japan .................................. 2-192469

[51] Int. Cl.$^5$ ............................................... B44C 1/22
[52] U.S. Cl. ............................... 156/626; 156/627; 156/643; 156/345; 204/298.32; 204/298.37
[58] Field of Search ............... 156/643, 646, 345, 626, 156/627; 204/192.33, 298.32, 298.37; 219/121.4, 121.41, 121.43; 165/11.1; 374/100, 107, 163

[56] References Cited

U.S. PATENT DOCUMENTS

| 4,913,790 | 4/1990 | Narita et al. ................... 204/192.13 |
| 4,956,043 | 9/1990 | Kanetomo et al. ................. 156/345 |
| 4,971,653 | 11/1990 | Powell et al. ....................... 156/626 |

FOREIGN PATENT DOCUMENTS

| 2566905 | 1/1986 | France . |
| 0229716 | 9/1988 | Japan .................................. 156/626 |
| 64-025018 | 1/1989 | Japan . |
| 64-41825 | 2/1989 | Japan . |
| 1558470 | 1/1980 | United Kingdom . |

*Primary Examiner*—William A. Powell
*Attorney, Agent, or Firm*—Oblon, Spivak, McClelland, Maier & Neustadt

[57] ABSTRACT

A system for measuring a temperature of a high-frequency electrode of a plasma etching apparatus has a temperature detecting element for detecting a temperature, a metal sheath member in which the temperature detecting element is provided to be insulated from it and which is kept in a DC floating state, an insulating member for insulating the sheath member from the high-frequency electrode, and a filter for removing a high-frequency component of an electrical signal sent from the temperature detecting element.

14 Claims, 3 Drawing Sheets

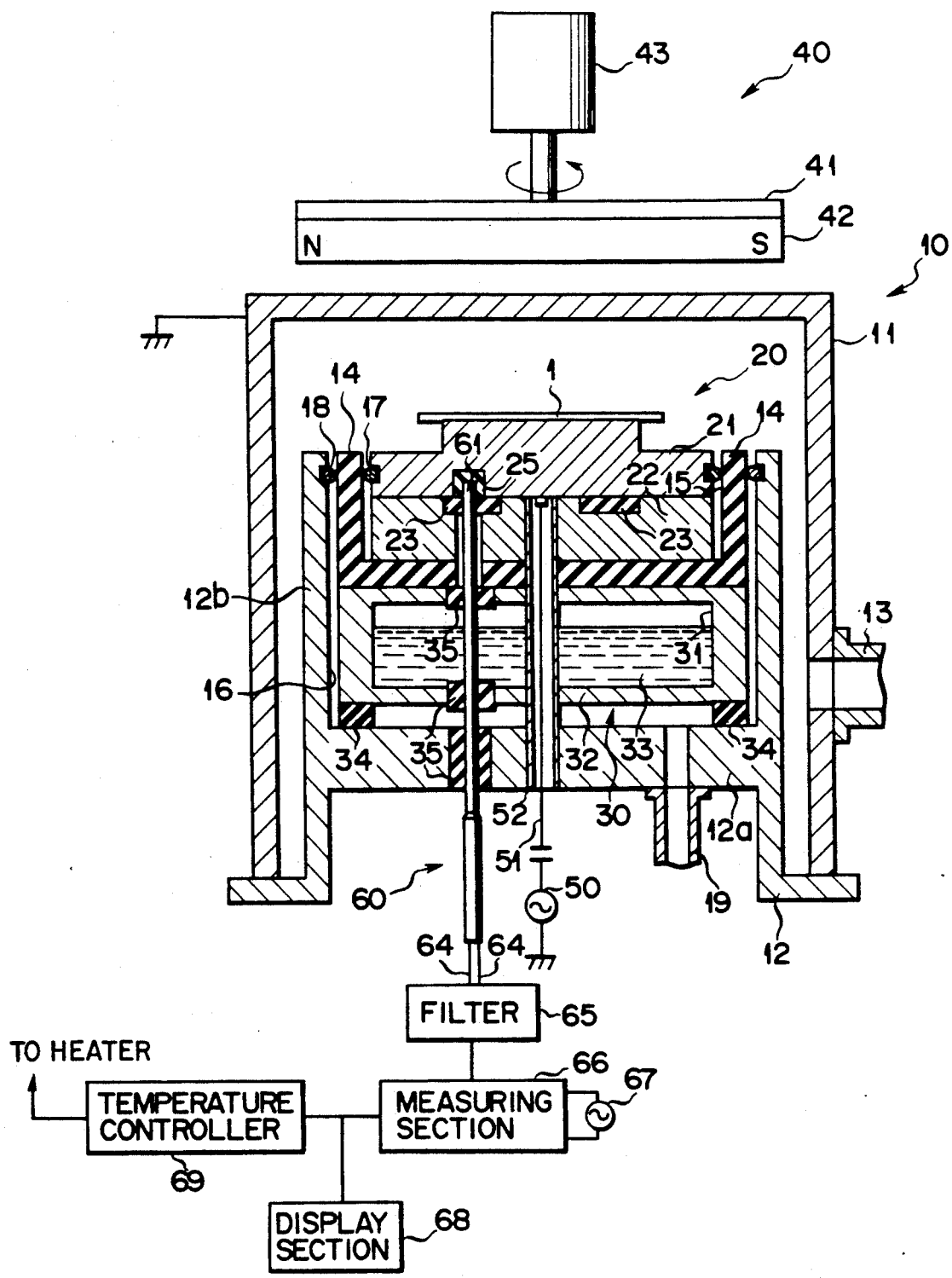
F I G. 1

PLASMA APPARATUS, AND METHOD AND SYSTEM FOR EXTRACTING ELECTRICAL SIGNAL OF MEMBER TO WHICH HIGH-FREQUENCY WAVE IS APPLIED

BACKGROUND OF THE INVENTION

1. Field of the Invention

The present invention relates to a plasma apparatus, and a method and system for extracting an electrical signal from an electrical signal transmitting medium, for example, a temperature measuring element placed under the influence of a high-frequency wave, of a member to which the high-frequency wave is applied.

2. Description of the Related Art

For example, in an RIE-scheme plasma etching apparatus, a susceptor which supports a semiconductor wafer as an object to be processed is used as a lower electrode, and a chamber or the like opposing the semiconductor wafer is used as an upper electrode. When an RF power is supplied across the opposing electrodes, a plasma is generated by an etching gas to perform plasma etching of the wafer. When an RF power source is connected to the susceptor, the susceptor serves as a high-frequency electrode, that is, an RF cathode.

When plasma etching of this type is performed, the wafer as the object to be processed is heated by the plasma. It is confirmed that when the wafer is cooled, highly anisotropic etching can be performed. Therefore, the wafer is cooled by heat transmission by cooling the susceptor. When the temperature of the susceptor is measured, the wafer temperature can be indirectly obtained, and the influence of the wafer temperature on etching can be controlled at a constant value based on the obtained temperature. A temperature measuring element such as a platinum resistor is used to measure the temperature of the susceptor.

However, since the susceptor is used as the RF cathode, RF noise is induced and superposed on a measured temperature signal. Therefore, it is difficult to measure a temperature correctly.

SUMMARY OF THE INVENTION

The present invention has been made based on the above situation, and has as its object to provide a plasma apparatus which can be obtained a correct temperature signal. It is another of the present invention to provide an electrical signal extracting method with which an influence of high-frequency induction noise is removed to enable correct electrical signal extraction.

It is still another object of the present invention to provide a system for extracting such an electrical signal.

First, the present invention provides a plasma apparatus for performing plasma treatment to an object to be processed, comprising:

a vacuum chamber;

a supporting table, for supporting the object, provided in the chamber;

plasma generating means for generating plasma by means of applying high-frequency power to the supporting table;

temperature detecting means, for detecting temperature of the supporting table, provided in the supporting table;

a metal container in which the temperature detecting means is arranged to be insulated therefrom and which is kept in a DC floating state;

filter means for filtering a output signal from the temperature detecting means to remove a high-frequency component of the signal; and temperature measuring means for measuring temperature of the supporting table based on the signal output from the filter means.

Second, the present invention provides a method of extracting an electrical signal which is sent from a member applied with a high-frequency wave and which has a lower frequency than the high-frequency power, comprising the steps of:

arranging a transmitting medium of an electrical signal to be extracted, inside a metal container to be insulated therefrom;

arranging the metal container to be insulated from the member to which the high-frequency power is applied;

keeping the metal container in a DC floating state; and causing filter means to remove a high-frequency component of the electrical signal sent from the transmitting medium.

Third, the present invention provides a system for extracting an electrical signal which is sent from a member applied with a high-frequency wave and which has a lower frequency than the high-frequency power, comprising:

a metal container in which a transmitting medium of an electrical signal to be extracted is arranged to be insulated therefrom and which is kept in a DC floating state;

insulating means for insulating the metal container from the member to which the high-frequency power is applied; and filter means for removing a high-frequency component of the electrical signal sent from the transmitting medium.

According to the present invention, temperature detecting means or an electrical signal transmitting medium is provided in a metal container having an electromagnetic shield effect to be electrically insulated, and the metal container is insulated from a member to which a high-frequency power is applied. The metal container is not grounded and set in a DC floating state. The floating state prevents noise mixture from common ground. The shield effect and this noise mixture prevention cause a decrease in influence of the high-frequency noise. A high-frequency component is removed by a filter means from an electrical signal to be extracted. As a result, an electrical signal having a very high precision can be extracted.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a schematic diagram of a magnetron plasma etching apparatus for practicing the present invention;

DETAILED DESCRIPTION OF THE PREFERRED EMBODIMENTS

Figure 2:
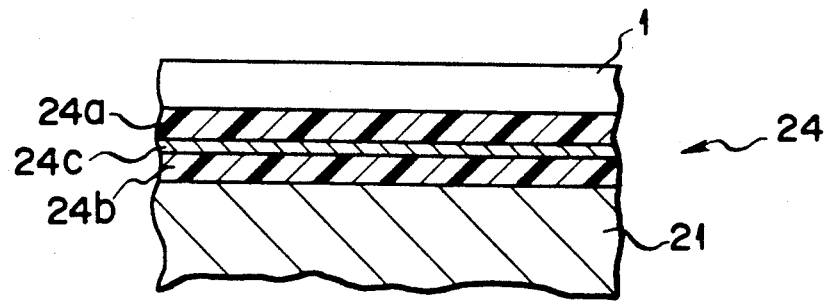
FIG. 2 is a sectional view showing an electrostatic chuck used in the apparatus of FIG. 1.

An embodiment of the present invention which is applied to temperature measurement of a susceptor of a magnetron plasma etching apparatus will be described in detail with reference to the accompanying drawings.

FIG. 1 is a schematic diagram of a magnetron plasma etching apparatus for embodying the present invention. This apparatus comprises a vacuum chamber 10, a susceptor 20, provided in the chamber 10, for supporting an object to be processed, for example, a semiconductor wafer 1, a cooling section 30 provided under the susceptor 30, a magnet section 40 provided above the chamber 10, an RF power supply 50, and a thermometer section 60.

The vacuum chamber 10 is made by, for example, aluminum and has cylindrical upper and lower chamber members 11 and 12. The lower end of the upper chamber member 11 is bonded to the lower chamber member 12. An exhaust port 13 is formed in the lower portion of the side wall of the upper chamber member 11, and the interior of the vacuum chamber 10 is evacuated by an exhaust pump (not shown) connected to the exhaust port 13. It is designed that the interior of the vacuum chamber 10 can be pressure-reduced to low pressure, for example, about $10^{-6}$ Torr. A plurality of gas diffusing ports (not shown) formed in the upper wall of the upper chamber member 11 shuck that etching gas is supplied to entire surface of the wafer uniformly. An etching gas supplied from a gas supply source is introduced into the chamber 10 through the plurality of gas diffusing ports. The lower chamber member 12 has a bottom wall 12a for supporting the cooling section 30 and the susceptor 20, and a cylindrical side wall 12b.

An electrically insulating first cylindrical ceramic member 14 having an open upper surface is provided on the cooling section 30, and the susceptor 20 is supported by the inner side of the bottom wall of the ceramic member 14 as it is surrounded by the side wall of the ceramic member 14. The susceptor 20 has an upper susceptor split 21 having a wafer support, and a lower susceptor split 22 for supporting the upper susceptor split 21. The upper susceptor split 21 is detachably fixed on the lower susceptor split 22. The susceptor 20 is split into halves in this manner so that, when it is contaminated, only the first upper susceptor split 21 need be replaced, thereby facilitating the maintenance. A heat-insulating gap 15 is defined between the side surface of the susceptor 20 and the inner side surface of the first insulating ceramic member 14.

A ceramic heater 23 is buried in the lower susceptor split 22 to face the bottom surface of the upper susceptor split 21. The ceramic heater 23 enables temperature control of the upper susceptor split 21.

An electrostatic chuck 24 for chucking the wafer 1 is provided on the upper surface of the upper susceptor split 21. The electrostatic chuck 24 comprises two insulating sheets (e.g., polyimide sheets) 24a and 24b, and a conductive sheet 24c, made of copper or the like, between the sheets 24a and 24b. The wafer 1 is loaded on the electrostatic chuck sheet 24 in the state of applying electrostatic chuck voltage for example 2 kV, D.C. to the conductive sheet 24c. After plasma generation, so that the wafer 1 is chucked on the susceptor 20 by a Coulomb force due to static electricity generating on the electrostatic chuck 24.

The cooling section 30 has a cylindrical cooling member 32 having a liquid nitrogen container 31 therein. Liquid nitrogen 33 is reserved in the liquid nitrogen container 31. The upper wall of the cooling member 32 supports the ceramic member 14. The inner bottom wall of the cooling member 32 is, for example, porous and can cause nucleate boiling. The inner side of the bottom wall of the cooling member 32 is kept at about $-169°$ C. by the nucleate boiling. The cooling member 32 is provided on the bottom wall 12a of the lower chamber member 12 through a ceramic insulating member 34.

The side wall of the lower chamber member 12 described above surrounds the ceramic member 14, the cooling member 32, and the insulating member 34. The inner surface of the side wall 12b is separated from the outer surfaces of the ceramic member 14, the cooling member 32, and the insulating member 34 to define a heat-insulating gap 16 therebetween.

O-rings 17 and 18 are respectively fitted in the upper ends of the gaps 15 and 16, thereby sealing the gaps 15 and 16. An exhaust port 19 is formed in the bottom wall 12a of the lower chamber member 12. The gaps 15 and 16 are evacuated by an exhaust pump (not shown) connected to the exhaust port 19 so that they serve as heat-insulating vacuum layers. Heat exchange between the wafer 1 and members other than the cooling member 32 is minimized because of the presence of the heat-insulating vacuum layers, and the wafer 1 can be efficiently cooled. Holes are formed in the insulating ceramic members 14 and 34 in order to efficiently vacuum the gaps 15 and 16.

The high-frequency power supply 50 is connected to the upper susceptor split 21 of the susceptor 20. A conductor wire 51 extending from the high-frequency power source 50 to the upper susceptor split 21 is provided inside an insulating pipe 52 that extends from the bottom wall 12a of the lower chamber member 12 through the upper susceptor split 21. The upper chamber member 11 is grounded, that is, it constitutes an RIE-scheme plasma etching apparatus. Therefore, when a high-frequency power is supplied, the upper wall of the upper chamber member 11 serves as the upper electrode, the susceptor 20 serves as the lower electrode, that is, the RF cathode, and a plasma is generated between them in the presence of an etching gas. The high-frequency power source 50 has a frequency of 13.56 MHz or more, for example, 13.56 MHz, 27 MHz, 40 MHz.

The magnet section 40 functions to apply a magnetic field between the electrodes in the direction perpendicular to the electric field therebetween. It has a horizontal support member 41, a permanent magnet 42 supported by the support member 41, and a motor 43 for rotating the support member 41 and the permanent magnet 42 in the direction of an arrow in FIG. 1.

Figure 3:
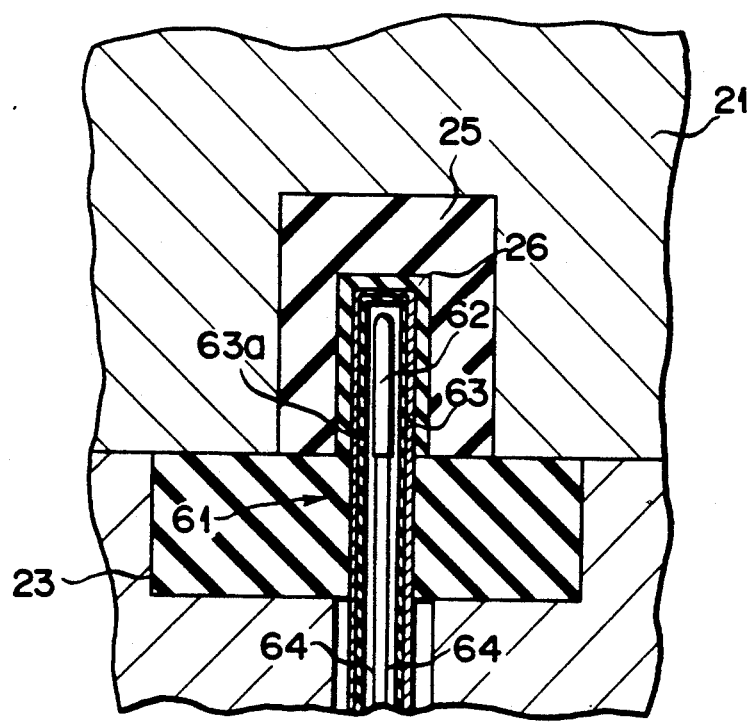
FIG. 3 is an enlarged view of a portion of the apparatus of FIG. 1 which is to be mounted to a high-frequency electrode of a temperature measuring member.

The thermometer section 60 will be described. In a plasma etching apparatus of this type, it is impossible to directly measure the temperature of the wafer 1. Therefore, the temperature of the upper susceptor split 21 is measured to perform wafer temperature control. For this purpose, a sheath type platinum resistor thermometer 61 is buried in the upper susceptor split 21. The sheath type platinum resistor thermometer 61 is constituted by providing a platinum resistor 62 in a thin metal container, e.g., a sheath member 63 made of stainless steel, through an insulating member 63a, as is described in detail in FIG. 3. The sheath type platinum resistor thermometer 61 is buried in a ceramic insulating member 25 fitted in the upper susceptor split 21 and having good heat conductivity. A cream 26 having good heat conductivity is filled between the ceramic member 25 and the sheath member 63.

The sheath member 63 covers the platinum resistor 62 and two conductor wires 64 and extends downward in a direction in which the conductor wires 64 extend from the platinum resistor 62. The sheath member 63 is not grounded at all and is electrically floating. Insulating seal members 35 are fitted between the sheath member 63 and the upper wall of the cooling member 32, between the sheath member 63 and the bottom wall of the cooling member 32, and between the sheath member 63 and the bottom wall 12a of the lower chamber member 12.

The conductor wires 64 are connected to a filter 65. The signal is filtered by the filter 65 to remove a high-frequency component, that is, high-frequency from the power supply 50, and only a low-frequency component is passed through the filter 65. The filter 65 is connected a measuring section 66. The measuring section 66 has a bridge circuit and the like. Upon reception of an AC power from a power supply 67 connected to the measuring section 66, the measuring section 66 measures the resistance of the platinum resistor 62 that changes depending on the temperature. The signal output from the measuring section 66 is input to both a temperature display section 68 and a temperature controller 69. The temperature controller 69 outputs a temperature control signal to the ceramic heater 23 on the basis of the signal sent from the filter 67, thereby controlling the susceptor temperature in a feedback manner. As a result, the wafer is kept at, e.g., $-60°$ C.

Figure 4:
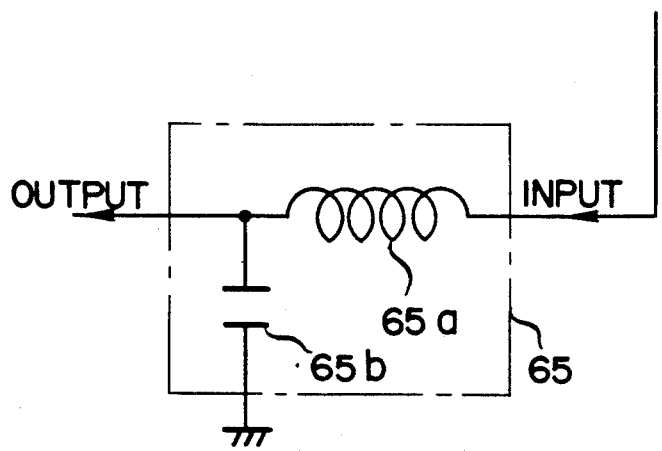
FIG. 4 is a circuit diagram of a filter used in the apparatus of FIG. 1.
Figure 5:
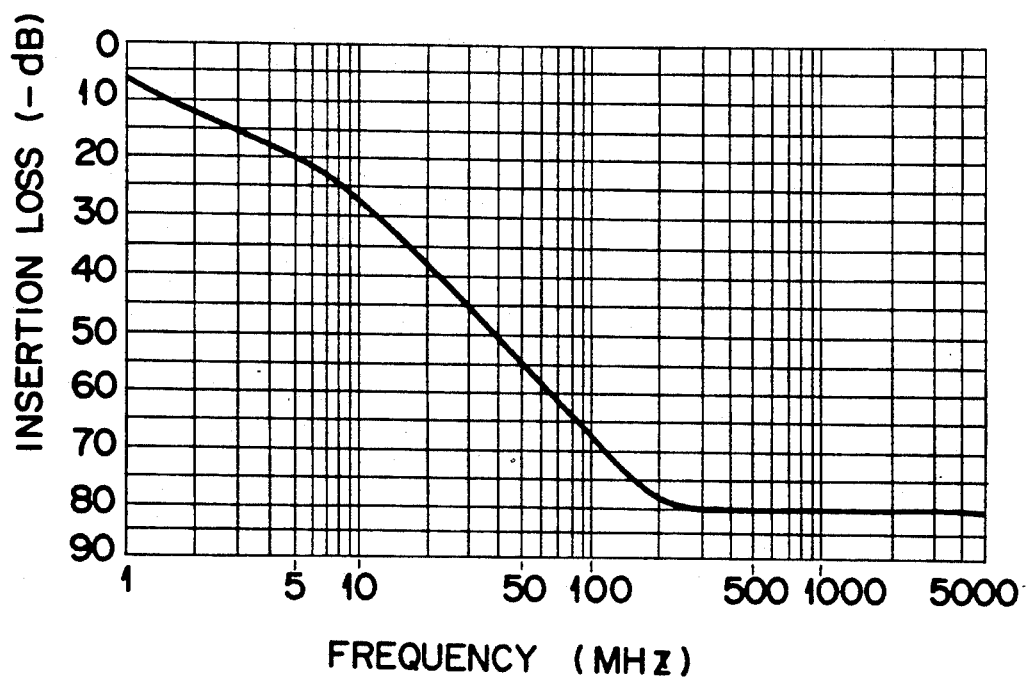
FIG. 5 is a graph showing a filter characteristic.

The filter 67 has a coil 67a and a capacitor 67b, as shown in FIG. 4, and exhibits, e.g., an insertion loss characteristic as shown in FIG. 5. A high-frequency component is removed, and only a low-frequency is output, as shown in FIG. 5.

In an apparatus having the above arrangement, an etching gas is introduced in the chamber 10, a high-frequency power is applied across the upper and lower electrodes to generate a plasma, and etching is performed by the plasma. At this time, a magnetic field is applied between the electrodes by the rotating permanent magnet 42. Therefore, electrons existing between the electrodes perform a cyclotride motion. As the electrons collide against molecules, magnetron discharge is generated and the number of ionization times of the molecules is increased, and an etching rate as fast as 1 $\mu$m/min. can be obtained even under a comparatively low pressure of $10^{-2}$ to $10^{-3}$ Torr. As a result, processing per wafer can be completed within a short period of time, and an etching reliability is improved. As the average ion energy is decreased, damage to a wafer is minimized.

When plasma etching is performed, the wafer 1 as an object to be processed is cooled to, e.g., about $-60°$ C. in order to perform highly anisotropic etching. During plasma etching, the temperature of the wafer 1 fluctuates as it is increased due to the heat of the plasma. Therefore, as has been described above, according to the present invention, the susceptor 20 is cooled by the liquid nitrogen 33 reserved in the liquid nitrogen container 31 of the cooling member 32. Also, the temperature of the upper susceptor split 21 is measured by the sheath type platinum resistor thermometer 61, and a control signal is output from the temperature controller 69 to the ceramic heater 23 to control the temperature of the upper susceptor split 21 to about $-60°$ C. In this case, since the susceptor 20 is used as the RF cathode, RF noise is induced and superposed on a measured temperature signal. Since a measured temperature signal output from the measuring section 65 is a low-frequency signal, if RF noise is superposed on it in this manner, correct temperature measurement becomes difficult.

According to the present invention, as the platinum resistor thermometer 61 is provided in the thin metal sheath member 63, superposition of the RF noise can be prevented to a certain degree by the electromagnetic shield effect. Since the sheath member 63 covers the conductor wires 64 as well, a similar shield effect can be obtained in this region. The sheath member 63 is insulated from the upper susceptor split 21 serving as the RF cathode by the ceramic insulating member 25 having good heat conductivity and the adhesive 26, and any portion of the sheath member 63 is not grounded. Therefore, the sheath member 63 is kept to be electrically floating. As a result, the sheath member 63 is not grounded to common ground of the RF cathode, and the RF noise induction from the common ground is prevented.

However, even if the shield effect is obtained by the sheath member 63 and the sheath member 63 is kept flowing in order to prevent noise mixture from common ground, it is difficult to completely prevent the RF noise superposition. For this reason, a measured temperature signal from the platinum resistor thermometer 61 is input to the filter 67 to remove a high-frequency component, thereby obtaining only a low-frequency component as a measured temperature signal. As a result, a temperature signal having a very small error can be obtained. On the basis of such a measured temperature signal, a control signal is output from the temperature controller 69 to the ceramic heater 23, and the temperature of the upper susceptor split 21 is controlled by the on/off operation of the heater 23. Hence, the temperature of the wafer 1 can be kept at substantially a constant value.

In this manner, the thermometer 61 is provided in the sheath member 63 to be insulated from it, and the sheath member 63 is insulated from the susceptor split 21. Therefore, RF power leakage is prevented, and efficient etching can be performed. In addition, the thermometer is prevented from being heated by a high-frequency wave.

Since the sheath type thermometer is used for temperature measurement, the thermometer is reinforced by the sheath member 63, thus improving the durability. In addition, the diameter of the conductor wires 64 can be made small by this reinforcement, resulting in a small thermometer.

The present invention is not limited to the above embodiment, but various changes and modifications may be made within the spirit and scope of the invention.

For example, the present invention is not necessarily applied to an RIE etching apparatus, but can be suitably applied to temperature measurement of various types of portions to which a high-frequency wave is applied. Various types of temperature measuring means having a thermometer covered with a metal container can be employed as far as they have the function of the present invention.

The present invention is not limited to temperature measurement but can also be applied to other measurements as far as they concern extraction of a weak signal which is sent from a member applied with a high-frequency wave and which has a lower frequency than that of the member to which the high-frequency wave is applied.

In above embodiment, the present invention is applied to a magnetron plasma etching apparatus. However, the present invention can be applied to other plasma apparatus such as a plasma CVD apparatus and sputtering apparatus.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma apparatus for performing plasma treatment to an object to be processed, comprising:
    a vacuum chamber;
    a supporting table, for supporting said object, provided in said chamber;
    plasma generating means for generating plasma by means of applying high frequency power to said supporting table;
    temperature detecting means, for detecting temperature of said supporting table, provided in said supporting table;
    a metal container in which said temperature detecting means is arranged to be insulated therefrom and which is kept in a DC floating state;
    filter means for filtering a output signal from said temperature detecting means to remove a high-frequency component of the signal; and
    temperature measuring means for measuring temperature of said supporting table based on said signal output from said filter means.

2. An apparatus according to claim 1, further comprising temperature controlling means for controlling the temperature of said supporting table.

3. A method of extracting an electrical signal which is sent from a member applied with a high-frequency wave and which has a lower frequency than the high-frequency power, comprising the steps of:
    arranging a transmitting medium of an electrical signal to be extracted, inside a metal container to be insulated therefrom;
    arranging said metal container to be insulated from the member to which the high frequency power is applied;
    keeping said metal container in a DC floating state; and
    causing filter means to remove a high-frequency component of the electrical signal sent from said transmitting medium.

4. A method according to claim 3, wherein said signal transmitting medium comprises a temperature detecting element for the member to which the high-frequency power is applied.

5. A method according to claim 4, wherein said signal transmitting medium comprises a platinum resistor.

6. A method according to claim 3, wherein the member to which the high-frequency power is applied is a high-frequency electrode.

7. A system for extracting an electrical signal which is sent from a member applied with a high-frequency wave and which has a lower frequency than the high-frequency power, comprising:
    a metal container in which a transmitting medium of an electrical signal to be extracted is arranged to be insulated therefrom and which is kept in a DC floating state;
    insulating means for insulating said metal container from the member to which the high-frequency power is applied; and
    filter means filtering the electrical signal sent from said transmitting medium to remove a high-frequency component of the signal.

8. A system according to claim 7, wherein said signal transmitting medium comprises a temperature detecting element for the member to which the high-frequency power is applied.

9. A system according to claim 8, wherein said signal transmitting medium comprises a platinum resistor.

10. A system according to claim 7, wherein the member to which the high-frequency power is applied is a high-frequency electrode.

11. A system for measuring a temperature of a high-frequency electrode of a plasma etching apparatus, comprising:
    a temperature detecting element for measuring the temperature;
    a metal container in which said temperature detecting element is arranged to be insulated therefrom and which is kept in a DC floating state;
    insulating means for insulating said metal container from said high-frequency electrode; and
    filter means for filtering an electrical signal sent from said temperature detecting element to remove a high-frequency component of the signal.

12. A system according to claim 11, wherein said temperature detecting element comprises a platinum resistor.

13. A system according to claim 11, wherein said plasma etching apparatus comprises a magnetron for applying a magnetic field to a plasma.

14. A system according to claim 11, further comprising temperature controlling means for controlling the temperature of said electrode.

* * * * *